(12) United States Patent
Park

(10) Patent No.: US 9,336,820 B2
(45) Date of Patent: May 10, 2016

(54) DATA SECTOR SYNC MARK WITH MULTIPLE PATTERNS

(71) Applicant: Seagate Technology LLC, Cupertino, CA (US)

(72) Inventor: Bumseok Park, Yongin-si (KR)

(73) Assignee: Seagate Technology LLC, Cupertino, CA (US)

( * ) Notice: Subject to any disclaimer, the term of this patent is extended or adjusted under 35 U.S.C. 154(b) by 124 days.

(21) Appl. No.: 13/927,419

(22) Filed: Jun. 26, 2013

(65) Prior Publication Data

US 2015/0006985 A1 Jan. 1, 2015

(51) Int. Cl.
*H03M 13/00* (2006.01)
*G11B 20/18* (2006.01)
*H04L 7/00* (2006.01)
*G11B 20/10* (2006.01)

(52) U.S. Cl.
CPC ............... *G11B 20/18* (2013.01); *G11B 20/10* (2013.01); *H04L 7/0016* (2013.01); *H03M 2201/2129* (2013.01)

(58) Field of Classification Search
CPC ............ H03M 2201/2129; H03M 13/33; H03M 13/1515; H04L 7/0016
See application file for complete search history.

(56) References Cited

U.S. PATENT DOCUMENTS

| | | | |
|---|---|---|---|
| 5,796,690 A | 8/1998 | Kanno | |
| 6,009,549 A * | 12/1999 | Bliss et al. | 714/769 |
| 6,301,679 B1 | 10/2001 | Tan | |
| 6,603,622 B1 | 8/2003 | Christiansen et al. | |
| 7,274,639 B1 * | 9/2007 | Codilian | G11B 20/1883 |
| | | | 360/31 |
| 7,852,596 B2 | 12/2010 | Boyle et al. | |
| 7,974,034 B1 | 7/2011 | Han et al. | |
| 8,117,518 B2 * | 2/2012 | Takashi et al. | 714/763 |
| 8,190,831 B2 | 5/2012 | Lee et al. | |
| 8,345,369 B2 | 1/2013 | Xia et al. | |
| 8,619,385 B1 * | 12/2013 | Guo | G11B 5/59655 |
| | | | 360/39 |
| 2004/0212912 A1 | 10/2004 | Okamoto et al. | |
| 2005/0024759 A1 * | 2/2005 | Sakai et al. | 360/48 |
| 2008/0062829 A1 * | 3/2008 | Yang | G11B 7/00736 |
| | | | 369/47.1 |
| 2008/0178060 A1 * | 7/2008 | Takashi et al. | 714/763 |
| 2010/0306617 A1 * | 12/2010 | Kondo et al. | 714/752 |
| 2011/0249356 A1 * | 10/2011 | Matsuo | 360/39 |

* cited by examiner

*Primary Examiner* — M. Mujtaba K Chaudry
(74) *Attorney, Agent, or Firm* — Hall Estill Attorneys at Law

(57) ABSTRACT

A data storage device may be configured with at least one data sector sync mark. Various embodiments are generally directed to a data sector having a sync mark and stored on a data storage medium with the sync mark having either a first or second patterns and a sync circuit configured to distinguish between the two different patterns to identify a status of at least some other portion of the data sector.

20 Claims, 3 Drawing Sheets

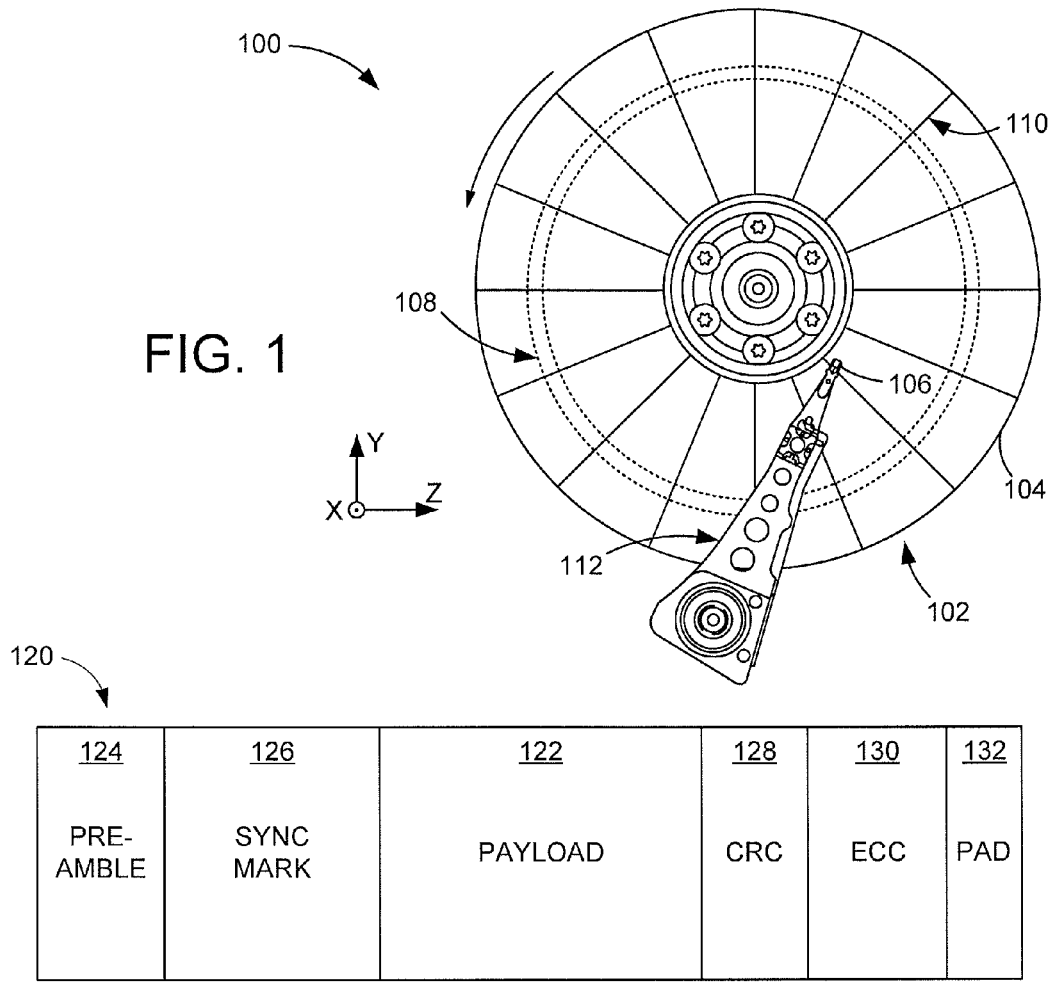
FIG. 1
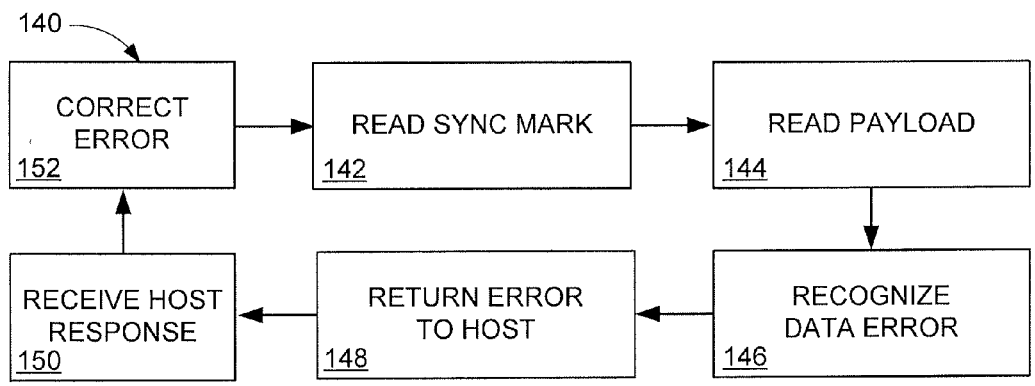
FIG. 2
FIG. 3

DATA SECTOR SYNC MARK WITH MULTIPLE PATTERNS

SUMMARY

Various embodiments are generally directed to data storage device with at least one data sector having a sync mark.

In accordance with some embodiments, a data sector may have at least one a sync mark stored on a data storage medium with the sync mark having either a first or second patterns and a sync circuit configured to distinguish between the two different patterns to identify a status of at least some other portion of the data sector.

BRIEF DESCRIPTION OF THE DRAWINGS

FIG. 1 illustrates a top view block representation of an example data storage device constructed and operated in accordance with various embodiments.

FIG. 2 displays a block representation of an example data sector capable of being implemented in the data storage device of FIG. 1.

FIG. 3 maps an example logic that may be carried out in association with the data sector of FIG. 2.

DETAILED DESCRIPTION

Figure 4:
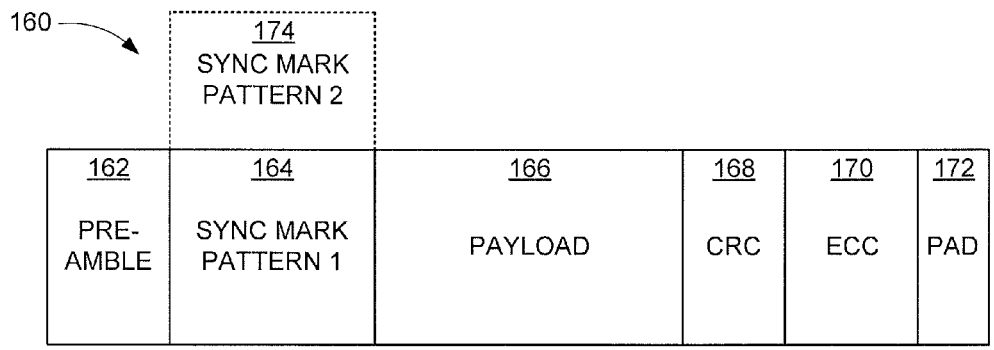
FIG. 4 is a block representation of an example data sector configured in accordance with some embodiments.

With computing systems advancing towards greater sophistication that includes higher data capacity, processing speeds, and data security, data storage devices are stressed to provide increased performance in smaller form factors. The minimization of data storage components along with increased data bit density on a data storage medium can provide increased data capacity, but may involve a larger number of data organization, security, and reliability data that diminishes the efficiency of data storage processing. For instance, greater numbers of data sectors in a data storage device can provide increased amounts of error correction data that are processed to read data from and write data to the device. Thusly, industry has continued to emphasize more efficient manners of handling data sector information and errors associated with data stored in a data storage device.

With these issues in mind, a data storage device may be configured with a data sector having at least one a sync mark stored on a data storage medium with the sync mark having either a first or second patterns and a sync circuit configured to distinguish between the two different patterns to identify a status of at least some other portion of the data sector. The ability to use a sync mark to identify the status of other portions of the data sector can allow for increased data sector processing as device firmware can be employed to intelligently handle the correction of errors. Conversely, a lack of data sector status identification can diminish data processing efficiency as the status of data sector portions are queried and subsequently handled by a host or by firmware. Accordingly, the dual function of a sync mark as an indicator of the exact location of user data in the data sector as well as the status of other data sector portions provides optimized data sector processing, which can be particularly useful in data storage devices with large data capacities.

While a data sector with an identifying sync mark can be practiced in an unlimited variety of data storage environments, FIG. 1 illustrates a top view of an example data storage device 100 that can employ one or more data sectors in accordance with various embodiments. The disk stack portion 102 of the data storage device 100 has at least one recordable medium 104 over which a head gimbal assembly (HGA) 106 travels along data tracks 108 to conduct various data access operations, such as data writing and reading operations.

Movement of the HGA 106 along the data tracks 108 encounters servo data written in predetermined servo patterns 110, such as wedge and spiral configurations, of the medium 104. In some embodiments, several HGAs 106 and recordable media 104 are vertically aligned to form a cylinder arrangement that can be continually practiced as each HGA 106 is moved by an actuator arm 112 that maintains each HGA 106 alignment regardless of which data track is being accessed. It can be appreciated that in some head disk stacks 102, each actuating arm 112 can support and rotate more than one HGA 106, such as in a disk-to-disk space between separate data media 104.

Various embodiments construct a data storage device exclusively with rotating data media and data access components like those shown in FIG. 1. However, such exclusivity is not required as a data storage device may be formed with both rotating data storage and solid state memory cells that concurrently operated within a common housing as a hybrid data storage drive. The combination of rotating and solid state types of memory can allow a controller to utilize the strengths of each memory type to optimize data storage capacity and data throughput. For example, a controller may utilize solid state memory for high speed data storage applications where minimal updating is needed while long term data storage involving numerous instances of data updates is carried out in the rotating data storage portion of the device.

Regardless of the type, size, speed, and configuration of a data storage device used in a data storage system, such as a distributed data storage network and mobile computing environment, data may be organized into predetermined data sectors with both data and data overhead regions. FIG. 2 displays a block representation of an example data sector 120 that can be present along a data track of a rotating data storage medium, such as data track 108 of FIG. 1, in accordance with some embodiments. As shown, the data sector is divided into separate regions that respectively correspond with user data written to a payload region 122 of the sector 120. That is, the data sector 120 can have an unlimited number of separate regions that provide operational, biographical, security, and error correction capabilities for the user data stored in the payload region 122.

One such operational region can be the preamble 124 that can be used to synchronize reading and writing operations with a data transducer, such as HGA 106 of FIG. 1. The data sector 120 and constituent preamble 124 can be configured to be any size, but the preamble 124 is usually a small portion of a 512 Kb data sector that is positioned between servo regions, such as servo pattern 110 of FIG. 1. A sync mark 126 is sequentially positioned in the data sector 120 next to the preamble 124 to function as an indication of the location of the payload region 122. As such, the sync mark 126 can simply buffer the payload region 122 from the preamble 124 with a predetermined pattern of programmed bits while preparing a data transducer for access to the data stored within the payload region 122.

Subsequent to data transducer access to the payload region 122, data overhead in the form of a cyclic redundancy check (CRC) region 128 can provide data verification while error correction code (ECC) 130 can allow optimized data reliability. In operation, the ECC 130 error correction scheme, which can be any number of predetermined codes, such as parity bits, Reed-Soloman, Golay, and Hamming algorithms, can check the accuracy of the data stored in the payload region 122 and return an error to a host if the payload data is not reliable. The ECC 130 may be changed to different schemes to provide greater or lesser error identification, but may do so at the cost of greater size as a proportion of the data sector 120 and higher processing requirements. Finally, the data sector 120 can have a pad region 132 defined by data bits that are purposely not programmed or programmed to a common logical state to differentiate between adjacent data sectors 120 or servo regions.

With the use of the various data sector regions, high data accuracy and data access speeds can be attained even in reduced form factor data storage devices where data bits are densely packed and data tracks have reduced widths. FIG. 3 is a logical map of an example data sector access routine 140 carried out in accordance with various embodiments. It should be noted that routine 140 may include an unlimited number of steps associated with reading data and data sectors of any size. Step 142 can begin routine 140 by reading at least one sync mark to synchronize and initialize the reading of data from a payload region in step 144. The data contained in the payload region may be firmware or user originated information that is subsequently cached, processed, and provided to a host.

The reading of an ECC region of the data sector after the payload region can indicate an error in the data stored in the payload region in step 146, as provided by the predetermined ECC scheme. Such data error recognition in step 146 proceeds to step 148 where the presence of a data error is returned to a host, which may be a controller, remote processor connected via a network, or end user. Step 150 next awaits a host response to the error, such as fix, ignore, and remedy the error at a later date. As a result of such host options, step 152 may correct the data error via a predetermined data recovery mechanism, which can involve the rewriting of the payload region. It can be appreciated that routine 140 can maintain a high level of data reliability while allowing a host to direct data correction activities.

However, the proliferation of system data, such as metadata, encryption codes, and booting information, being stored in payload regions of data sectors by system firmware has made querying a host of every recognized data error inefficient, especially with modern data storage systems having high processing capabilities that can automatically handle multiple activities simultaneously at speeds much faster than when a host directs error responses. In yet, removing host directed error response completely can produce inadvertent data relocation, updating, and loss of host logging of encountered data errors. Hence, an intelligent balance of querying a host and automatically conducting error response with system firmware can optimize data storage operations while maintaining data accuracy and data access speeds.

FIG. 4 illustrates a block representation of an example data sector 160 configured in accordance with some embodiments to provide intelligent data error management in a rotating data storage environment. While the data sector 160 generally has similar regions to sector 120 of FIG. 2 such as the preamble 162, sync mark 164, payload 166, CRC 168, ECC 170, and pad 172, the sync mark 164 is written as one of several distinguishable patterns that can concurrently indicate the location of the payload 166 to a data transducer and identify the status of the ECC 172, which consequently corresponds to the status of the data stored in the payload 166.

That is, a first sync mark pattern 164 can indicate the ECC has been written by a user, which corresponds to the payload region 166 storing user data. Conversely, a different sync mark pattern 174 can identify an ECC status where the ECC 172 and payload region 166 are not written with user data. Such ECC status allows the ECC 172 and payload region 166 to be written with system data, like metadata, or to be blank and awaiting data of any kind. The identification of ECC status may further return the type of ECC scheme present in the ECC region 172, which can be evaluated to render the type of data stored in the payload region 166.

The use of the sync mark patterns 164 and 174 to identify various ECC statuses allows processing means to treat data from the payload region 166 according to potential data correction mechanisms. For example, payload and ECC data identified as written by a user can be redundantly cached to allow efficient data correction, if needed, while payload and ECC data identified as not written by a user can be immediately corrected, relocated, and flagged by system firmware without polling a user. The ability to distinguish the origin of the ECC and payload data can thusly allow for the differentiated treatment of the payload data, which may optimize data storage operations, especially in the presence of an identified payload data error.

Figure 5:
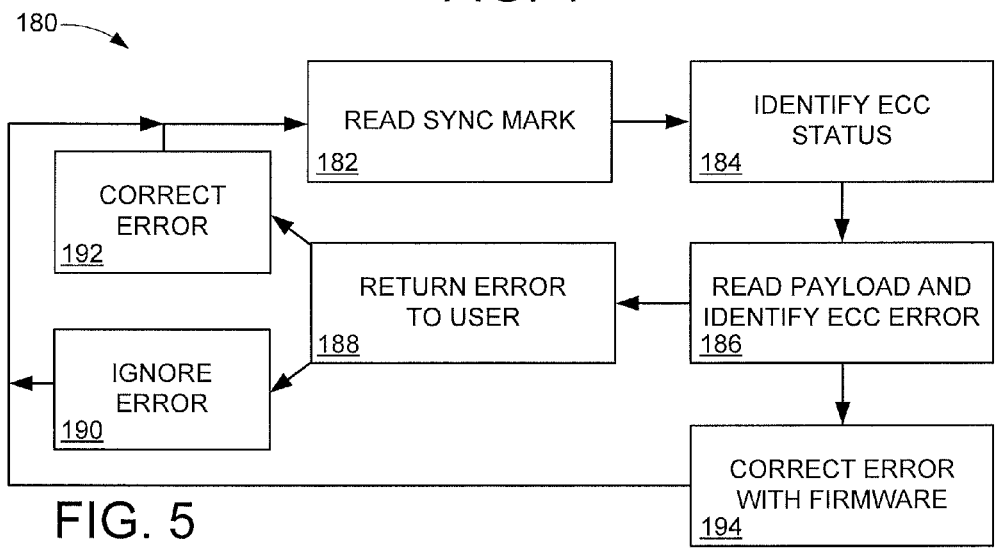
FIG. 5 provides an example logic that can be carried out in association with the data sector of FIG. 4.

FIG. 5 maps a logic stream for an example data sector access routine 180 carried out in accordance with various embodiments with different sync mark patterns being exclusively implemented into at least one data sector of a data storage device. Step 182 can initially read the bit pattern of the single sync mark to concurrently synchronize data transducer position relative a payload region of the data sector and identify a status of the ECC of the data sector in step 184. Such identification can indicate if the ECC has been written, by whom the ECC was written, when the ECC was written, and the ECC scheme present. This diverse ECC identification may allow for a variety of diverse processing and data management activities to be conducted before or during the reading of payload data in step 186. One such activity may be the application of a heightened ECC scheme to the payload data if the payload region was written by a user. The reading of the payload data in step 186 can further involve the identification of an ECC error via comparison of the payload data to the ECC scheme present in the data sector or remotely stored.

With the recognition that an error is present in the data sector, the different sync mark patterns can be utilized to indicate how the error is processed. In the non-limiting embodiment shown in FIG. 5, ECC and payload data written by a user can correspond with step 188 returning the error to a host, which can subsequently result in the error being ignored in step 190 or the error being corrected in step 192, as dictated by the host. In the event the ECC and payload data has system information not written by a user, but instead by system firmware, or the ECC and payload regions are blank, step 194 uses firmware to automatically correct the error without querying the host or having error correction dictated by the host. The automatic handling of data sector errors in step 194 allows the firmware to immediately, sporadically, and routinely schedule error correction at times most conducive to system performance. For instance, the firmware can delay error correction until several data sectors in a proximal area of the data storage medium need correcting or in low system processing times.

The identification of ECC by the sync mark for use in payload data and error correction is juxtaposed to error management that always queries a user, handles errors with firmware, or conducts a predetermined data sector operation. The different sync mark pattern and corresponding identification of the ECC status can thusly be utilized in a multitude of manners to respond to encountered errors intelligently by assigning appropriate error control based on the origin of the ECC and payload data. The ability to understand the source, type, and age of the ECC data may further allow data sector management operations, like heightened ECC scheme, to be conducted automatically with system firmware and concurrently with other data writing operation, which differs from awaiting a response from a queried host. Accordingly, the use of different sync mark patterns allows for proactive data sector operations as opposed to reactive operations that can be delayed for a variety of reasons.

Figure 6:
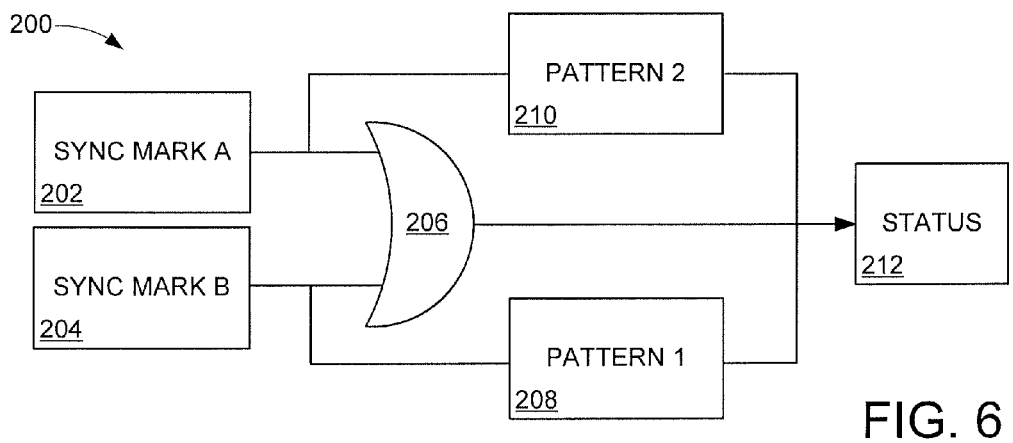
FIG. 6 displays a block representation of an example sync circuit capable of detecting sync marks of a data sector in accordance with various embodiments.

FIG. 6 shows a block representation of an example sync circuit 200 configured and operated in accordance with some embodiments. The sync circuit 200 may be constructed to read and write a plurality of different sync mark patterns, such as sync mark A 202 and sync mark B 204 to a data sector of a data storage device. Upon encountering an existing sync mark pattern, the sync circuit 200 may conduct one or more logic evaluations like the OR gate logic 206 displayed in FIG. 6 to distinguish between the plurality of sync marks. The logic 206 may further include at least reference patterns 208 and 210 that correspond to and identify the respective sync marks of the plurality of sync marks. As a result of the logic analysis of an encountered sync mark, the sync circuit 200 can output a status signal 212 to a host, operating system, and controller to identify the status of a different portion of the data sector, such as payload and ECC regions.

Figure 7:
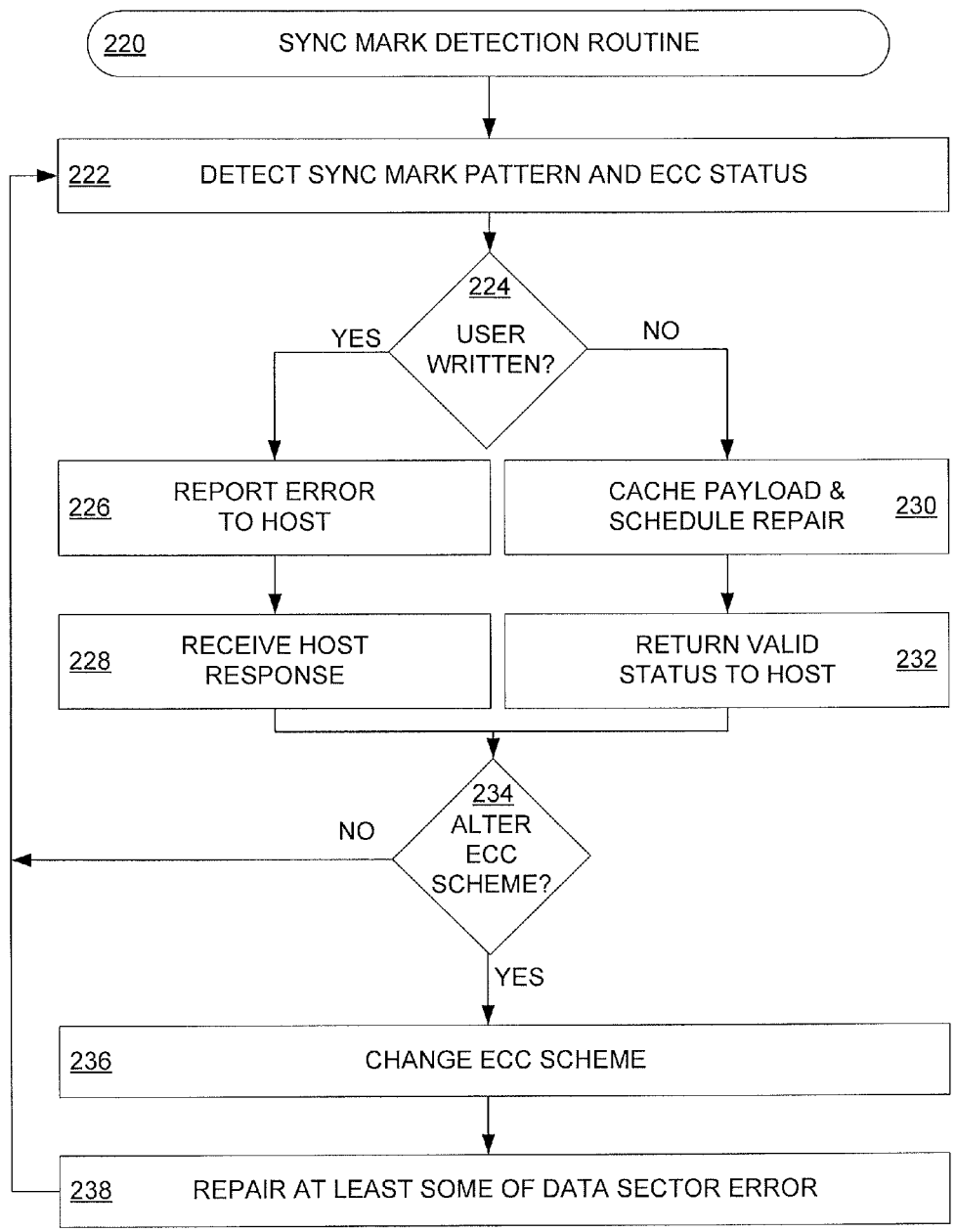
FIG. 7 is a flowchart of an example sync mark detection routine carried out in accordance with some embodiments.

Through the use of one or many different sync mark patterns, a data sector can be more efficiently read and processed as proactive payload and ECC actions can be taken by knowing the status of ECC and payload regions of the data sector. FIG. 7 provides a flowchart of example sync mark detection routine 220 carried out in accordance with various embodiments. Step 222 can first detect a single sync mark pattern in at least one data sector and identify ECC status based on comparing the sync mark pattern to a preexisting register. Some embodiments concurrently identify sync mark patterns and ECC status for numerous different data sectors, such as for data sectors in close physical proximity on a data storage medium, but such embodiment is not required or limiting.

The detected sync mark pattern and ECC status are then evaluated in decision 224 to determine if the ECC and payload data of the data sector has been written by a user. It should be noted that decision 224 may further evaluate an unlimited number of ECC status conditions like age and scheme to more intelligently identify the data contained within a data sector. With the ECC status indicating data written by a user, the routine 220 prepares for any encountered data sector errors and subsequently reports any errors to a host in step 226. Querying the host next awaits a host response to the error that is received in step 228 to dictate action in response to the reported error.

Alternatively, the identification that the data sector was not written by a user in decision 224 proceed to step 230 where payload data is cached to a separate, temporary memory location and an error repair is scheduled. The actions of step 230 are conducted automatically and without host query or initialization, which allows for maximum efficiency. With the error being handled by system firmware in step 230, a host may be informed in step 232 that the data sector is valid and error free, even though firmware has yet to conduct any repair or reallocation operations. Such valid signal can allow optimized system performance and command request execution that utilizes sophisticated processing and data handling capabilities of modern data storage systems.

Whether the data sector was written by a user or not, decision 236 can determine if the ECC scheme is to be altered. The presence of multiple errors over time may be used to prompt decision 234 to change the ECC scheme of at least one data sector in step 236, such as from Reed-Solomon to Golay code, to increase data accuracy in data sectors with a history of errors occurring for any reason. If no ECC scheme alteration is to be performed at the conclusion of step 236 or concurrently with step 236, step 238 can repair some or all of the data sector. For example, the ECC data can be checked and if it is soft ECC, the data sector will be used normally after user data is written and if it is hard ECC, the data sector will be reallocated without notice to a host. The repair operations of 238 may further be conducted, in various embodiments, on the payload region to exclusively rewrite, partially update, and erase to remedy the detected error while keeping the existing ECC code unchanged. The repair of the error in step 238 advances routine 220 back to step 222 to await the detection of another sync mark, which may occur for a repaired or new data sector.

While the various steps and decisions of routine 220 can provide optimized data sector reading and writing, especially in response to data sector errors, the assorted aspects of routine 220 are not required or limiting. That is, any decision and step can be changed, moved, and omitted from routine 220 at will. As a non-limiting example, step 230 may be skipped so that data sector errors are immediately repaired by system firmware in step 234 upon detection of the error.

The optimization of a data sector sync mark to concurrently identify the location of a payload region and the status of an ECC region of the data sector allows for a selected balance between returning errors to a host and handling errors automatically with system firmware. Such balance of error control can ensure the host has ample knowledge and control of user written data sectors and system firmware can maximize performance by automatically handling errors to data not written by a user. As a result, data sector operations and error handling can be conducted proactively, which corresponds to increased system efficiency as the system is not always awaiting error handling orders from a queried host upon a discovered data sector error.

It is to be appreciated that the claimed technology can readily be utilized in any number of applications, including network and mobile data storage environments. It is to be understood that even though numerous characteristics of various embodiments of the present disclosure have been set forth in the foregoing description, together with details of the structure and function of various embodiments, this detailed description is illustrative only, and changes may be made in detail, especially in matters of structure and arrangements of parts within the principles of the present technology to the full extent indicated by the broad general meaning of the terms in which the appended claims are expressed.

What is claimed is:
1. An apparatus comprising:
   first and second data sectors each stored on a data storage medium and each having a single sync mark positioned between preamble and payload portions of the respective data sectors, a first sync mark of the first data sector being different from a second sync mark of the second data sector; and
   a sync circuit configured to interpret the first sync mark to identify the payload portion of the first data sector con- tains user data and interpret the second sync mark to identify the payload portion of the second data sector does not contain user data.

2. The apparatus of claim 1, wherein the at least some of the data sector comprises an error correction code (ECC).

3. The apparatus of claim 2, wherein the first sync mark identifies a status of the ECC as user written.

4. The apparatus of claim 2, wherein the second sync mark identifies a status of the ECC as user unwritten.

5. The apparatus of claim 2, wherein each data sector comprises a cyclic redundancy check positioned between the payload and ECC.

6. The apparatus of claim 2, wherein the data sector is proactively cached to a separate memory in response to the status of the ECC being user unwritten.

7. A data storage device comprising:
   first and second data sectors each having a single sync mark and stored on a data storage medium, the single sync mark positioned between preamble and payload portions of the respective data sectors, a first sync mark of the first data sector having a first data bit pattern and a second sync mark of the second data sector having a second data bit pattern, the first and second data bit patterns being different; and
   a sync circuit configured to distinguish between the two data bit patterns to identify if an error correction code portion of the respective data sectors has been altered.

8. The data storage device of claim 7, wherein the data storage medium is part of a hybrid data storage system comprising rotating and solid state data storage.

9. The data storage device of claim 7, wherein the first and second data bit patterns are respectively interpreted by the sync circuit to identify if the error correction code portion has been previously written by a user.

10. The data storage device of claim 7, wherein each data sector has only one sync mark and only one payload portion.

11. The data storage device of claim 7, wherein the sync circuit has pattern recognition logic to distinguish between the two different data bit patterns.

12. The data storage device of claim 11, wherein the pattern recognition logic comprises an OR gate.

13. The data storage device of claim 11, wherein the pattern recognition logic is present in a controller.

14. A method comprising:
   storing a first sync mark on a first data sector and a second sync mark on a second data sector, each data sector stored on a data storage medium and having a single sync mark positioned between payload and preamble portions of the respective data sectors, the first sync mark being different than the second sync mark;
   identifying a first error correction code portion of the first data sector has been altered in response to user data being written to a first payload portion of the first data sector by distinguishing between the first and second sync marks with a sync circuit; and
   using the sync circuit to identify a second error correction code portion of the second data sector has been not been altered and a second payload portion of the second data sector has not been written with user data by distinguishing between the first and second sync marks with the sync circuit.

15. The method of claim 14, wherein the first sync mark has a first data bit pattern and the second sync mark has a second data bit pattern, the first and second data bit patterns being different.

16. The method of claim 14, wherein the sync circuit prompts a host of an error correction code error in response to the first sync mark.

17. The method of claim 16, wherein the sync circuit prompts automatically corrects an error correction code error without prompting the host in response to the identification of the second sync mark.

18. The method of claim 17, wherein the error correction code error is corrected by firmware without user initiation.

19. The method of claim 16, wherein the first error correction code portion is upgraded from a first error correction code scheme to a different second error correction code scheme in response to the host being prompted.

20. The method of claim 19, wherein the first error correction code scheme comprises parity bits and the second error correction code scheme comprises Reed-Solomon bits.

* * * * *